United States Patent [19]

Tanski et al.

[11] Patent Number: 4,893,161
[45] Date of Patent: Jan. 9, 1990

[54] QUANTUM-WELL ACOUSTIC CHARGE TRANSPORT DEVICE

[75] Inventors: William J. Tanski; Sears W. Merritt; Robert N. Sacks, all of Glastonbury, Conn.

[73] Assignee: United Technologies, Hartford, Conn.

[21] Appl. No.: 100,795

[22] Filed: Sep. 24, 1987

[51] Int. Cl.$^4$ .................. H01L 29/78; H01L 27/14; H01L 29/205; H01L 45/00

[52] U.S. Cl. .................................. 357/24; 357/4; 357/16; 357/30

[58] Field of Search .................. 357/4, 16, 24, 30 E

[56] References Cited

U.S. PATENT DOCUMENTS

| | | | |
|---|---|---|---|
| 3,858,232 | 12/1974 | Boyle et al. | 357/24 |
| 4,163,237 | 7/1979 | Dingle et al. | 357/16 |
| 4,424,525 | 1/1984 | Mimura | 357/24 M |
| 4,550,331 | 10/1985 | Milano | 357/24 M |
| 4,683,484 | 7/1987 | Deruits | 357/16 |
| 4,799,244 | 1/1989 | Mikoshiba et al. | 357/24 |

OTHER PUBLICATIONS

"Quantum-well Charge-coupled Devices for Charge-coupled Device-addressed Multiple-quantum-well Spatial Light Modulators", by W. D. Goodhue, B. E. Burke, K. B. Nichols, G. M. Metze, and G. D. Johnson 1 Nov. 1985, pp. 769–772, (J. Vac. Sci. Technol. B 4(3) May./Jun. 1986.

"Charge Transport by Surface Acoustic Waves in GaAs", by Michael J. Hoskins, Hadis Morkoc, and Bill Hunsinger, 15 Apr. 1982, pp. 332–334, (Appl. Phys. Lett. 41(4), 15 Aug. 1982.

"Monolithic GaAs Acoustic Charge Transport Devices", by Michael J. Hoskins and Bill J. Hunsinger, pp. 456–460, (1982 Ultrasonics Symposium).

Primary Examiner—Gene M. Munson
Attorney, Agent, or Firm—Eric W. Petraske

[57] ABSTRACT

An improved acoustic charge transport device having an acoustic wave passing through a piezoelectric semiconductor is improved by utilizing heterostructure Quantum-wells for confining charge packets.

3 Claims, 2 Drawing Sheets ns in this invention pursuant
QUANTUM-WELL ACOUSTIC CHARGE TRANSPORT DEVICE The Government has rights in this invention pursuant to Contract No. F33615-86-C-1138 awarded to the Department of the Air Force.

TECHNICAL FIELD

The field of the invention is that of SAW devices on GaAs, in particular that of acoustical charge transport devices.

BACKGROUND ART

It is known to construct an acoustic charge transport delay line using a SAW transducer to launch an acoustical wave through a piezoelectric slab of semiconductor. FIG. 1 illustrates a sketch of a prior art device. Note that a confinement electrode and backgating is required in order to confine the charge packets in the transport channel that are carried along by the acoustic wave within the Gallium Arsenide (GaAs) slab.

It is also known in the art to use a charge-coupled device to transport packets of charge down a delay line.

DISCLOSURE OF INVENTION

The invention relates to an improved acoustical charge transport device in which an acoustic wave passing through a piezoelectric semiconductor forms a series of potential wells that transport packets of charge along with the wave. The improvements relate to a superior confinement mechanism to form the transport channel to confine the charge packets within the desired region.

The foregoing features and advantages of the present invention will become more apparent in light of the following detailed description of the best mode for carrying out the invention and in the accompanying drawings.

BEST MODE FOR CARRYING OUT THE INVENTION

As was discussed above, a drawback with the prior art acoustic charge transport device was the need for a set of electrodes and corresponding power supplies and backgating to the epitaxial layer in order to institute bias fields to confine the electrons within the transport channel.

Figure 2A:
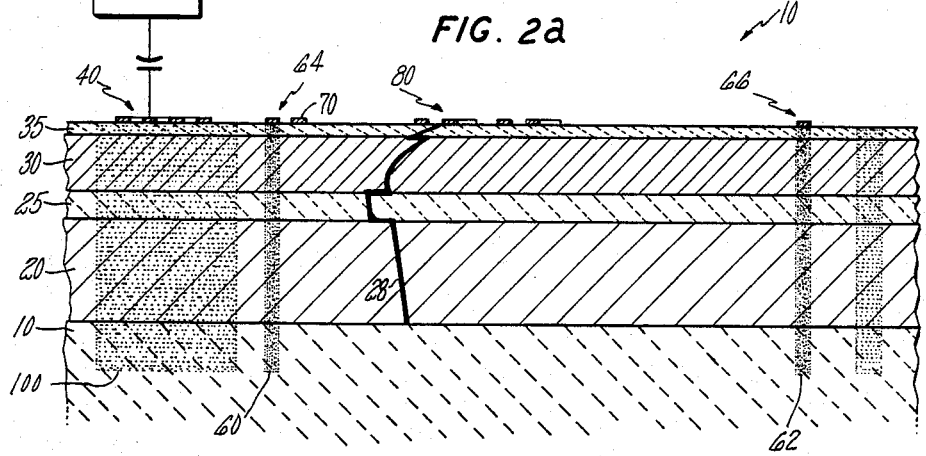
FIGS. 2a and 2b illustrate cross-sectional and plan views, respectively, of a device constructed according to the invention.

Referring now to FIG. 2a, there is shown in cross-section a preferred embodiment of the invention. Substrate 10 is any convenient material, illustratively GaAs. A first layer 20, referred to as the lower trapping layer, follows along the horizontal surface of the substrate and is formed from Aluminum Gallium Arsenide (Al,Ga)As and has a thickness between 100 and 1,000 nanometers. Other materials for the trapping and transport layers might be used and still be within the scope of the invention. Above the lower trapping layer, there is a layer 25 of GaAs, Indium Gallium Arsenide (In,Ga)As or other material, illustratively 40 nanometers thick, that will be referred to as the charge transport layer. It is through this layer that packets of electrons are carried by the acoustic wave. Above GaAs or (In,Ga)As layer 25 there is an upper trapping layer 30, also of (Al,Ga)As, but n-doped. This upper trapping layer has an illustrative thickness of 70 nanometers. The n-doping provides electrons to satisfy traps associated with the free surface of the material. A cap layer 35 is formed of GaAs.

A curve 28 is drawn superimposed on the cross-section in a conventional manner to indicate the potential of the lowest level of the conduction band. As can be seen, it drops sharply to a bottom level within layer 25 and rises back again to form a channel of lowered electronic potential. This conduction band structure has formed a potential well based on the difference in conduction band potential levels between (Al,Ga)As and GaAs. The thickness of the GaAs layer 25 is chosen, among other reasons, to provide maximum charge capacity by being thick enough to exceed the electron wavelength in the channel. The optimum thickness is in the range of 20 to 40 nanometers. No benefit comes from thicknesses greater than about 50 nm, because the mutual repulsion of the electrons produces a concentration at the top and bottom surfaces. It will be readily apparent to those skilled in the art that electrons somehow injected into layer 25 will be confined vertically between layers 20 and 30 by the effect of the potential illustrated in the curve 28.

Figure 1:
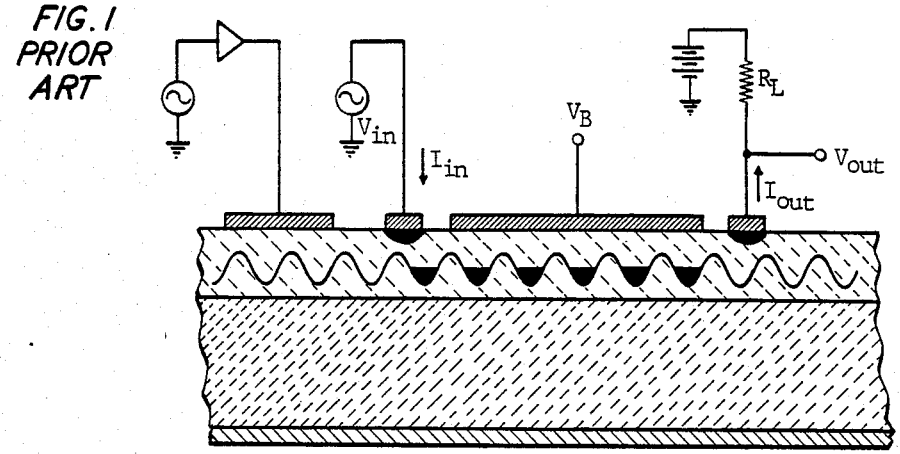
FIG. 1 illustrates a prior art device.

This illustrates a substantial improvement over the prior art device illustrated in FIG. 1, since there is now no need for backgating or to provide the prior art electrodes or the prior art power supplies to bias the electrodes.

Lateral confinement of charge packets perpendicular to the plane of the paper in FIG. 2a is provided by an area surrounding slab 25 that is rendered insulating, by conventional boron isolation, for example. This area is indicated in the cross-section and in the plan view of FIG. 2b by the numeral 100. Alternatively, other areas may be rendered insulating by etching away the epitaxial layer, thus placing the entire transport channel on an epitaxial mesa.

Figure 2B:
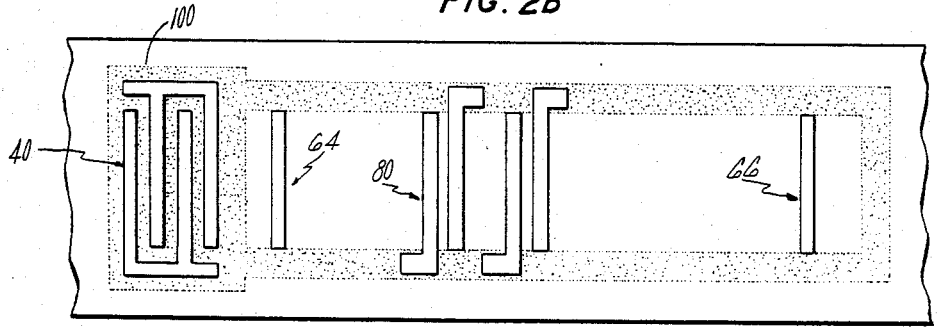

Referring now to FIG. 2b, there is shown a conventional SAW transducer positioned on a section of insulating region 100 and indicated by the numeral 40, that transforms an electrical RF signal from generator 50 into an acoustic wave traveling through the several layers shown in the cross-section in FIG. 2a. SAW transducer 40 rests on an insulating area where the epitaxial layer has been etched away. The wave length in GaAs at a frequency of about 280MHz is approximately 10 microns and the bulk of the power of the wave will be confined to the top layer of approximately 5 microns. There is thus an acoustical wave traveling from left to right in FIG. 2a that contains alternate phases of compression and rarefaction. Since GaAs is piezoelectric, these phases will produce a corresponding electrical potential that travels along with the acoustical wave. It will be evident to those skilled in the art that there will be potential wells formed in layer 25. These wells travel along with the acoustical wave, moving the charge packets along with them.

The length of the delay line being formed by this device is bounded by an input terminal and an output terminal, respectively referred to by numerals 60 and 62, which are relatively heavily doped areas sufficient to form an ohmic contact extending from the surface down at least through layer 25. Electrons entering from electrode 64 of the input section may travel freely down ohmic contact 60 to the intersection between contact 60 and layer 25. When a potential well passes through contact 60 traveling from left to right, electrons are formed into packets and may flow from contact 60 into the right hand portion of layer 25, carried along by the potential well. They then travel through the length of layer 25 until they reach ohmic contact 62 that provides an escape path out through electrode 66.

If terminals 64 and 66 are connected by a wire, current will flow around the loop formed by the wire, ohmic contacts 60 and 62, and charge transport layer 25. The motivating power to circulate electrons around the loop is provided by the SAW wave, of course. This steady train of charge packets may be controlled, for example by electrode 70. Electrode 70 may be biased negative to create a potential barrier that is high enough to prevent the force of the SAW wave from carrying electrons past the barrier region. Thus, pulses applied to electrode 70 can selectively block or permit the passage of a charge packet. Information may thus be carried in selected locations in the pulse train by controlling electrode 70. The presence or absence of a charge packet in a selected region will be noted by a corresponding voltage on any of the intermediate electrodes 80. The device thus described therefore forms a tapped delay line that can be used for a number of applications, as is known to those skilled in the art.

In the preferred embodiment, the size of the electron packet within layer 25 is limited to a maximum of a few million. The doping density of layer 30 is approximately $2 \times 10^{17}/cm^3$ with a thickness of 70 nanometers to provide charge necessary to satisfy surface states.

In a preferred embodiment; substrate 10 is semi-insulating GaAs with a thickness of 0.5 mm; Buffer layer 20 is undoped (Al,Ga)As with 30% replacement of Gallium and a thickness of 1000 nm; transport layer 25 is undoped GaAs with a thickness of 40 nanometers; trapping layer 30 is (Al,Ga)As with 30% replacement of Ga, doped at $2 \times 10^{17}/cm^3$, with a thickness of 70 nanometers; and cap layer 35 is undoped GaAs with a thickness of 20 nanometers.

Other combinations of semi-conductors having piezoelectric properties are readily known to those skilled in the art and may be substituted for the GaAs and (Al,Ga)As embodiment disclosed herein. For example, one alternative is the use of an (Al,Ga)As buffer layer 20 with an (In,Ga)As (with 15% Indium replacement) transport layer 25, 20 nanometers thick. Also, InP could be used for layers 20 and 30 with (In,Ga)P (with 53% Indium replacement) as transport layer 25. The criteria to be satisfied by a combination of materials are the depth of the quantum well and good piezoelectric properties coupled with a sufficiently good lattice match to the underlying layer.

Figure 3:
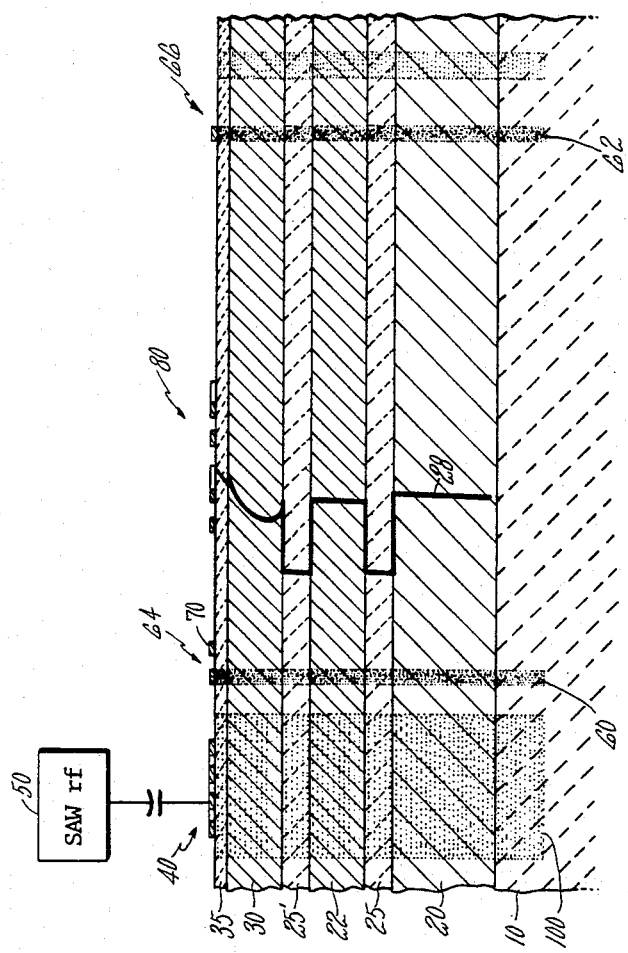
FIG. 3 illustrates an epitaxial layer structure that can also be used.

The layer 25 is known as a quantum well, and several quantum wells may be produced by epitaxial growth techniques to increase the charge capacity of the device. Such a structure with two quantum wells is shown in FIG. 3. A spacer layer 22 has been added between transport layers 25 and 25'. Spacer layer 22 is formed of (Al,Ga)As, with 30% of the Ga replaced by Al; is undoped and has a thickness of 100 nanometers. This method of increasing the charge capacity is preferable to increasing the dimension of layer 25 perpendicular to the plane of the paper because the SAW wave is limited in the transverse dimension that it can effectively cover.

Although the invention has been shown and described with respect to detailed embodiments thereof, it should be understood by those skilled in the art that various changes in form and detail thereof may be made without departing from the spirit and the scope of the claimed invention.

We claim:

1. An integrated electronic acoustic charge transport device comprising:

a substrate defining a horizontal plane;

charge transport layer of piezoelectric semiconductive material, having a transport layer thickness and a transport layer conduction band potential, disposed above said semiconducting substrate and having a predetermined relationship thereto;

surface acoustic wave means disposed above an insulating support means and mechanically connected to said charge transport layer, for passing acoustic waves along a predetermined path in said charge transport layer;

electron confinement means for preventing the escape of electrons from said predetermined path;

electron supply means for supplying and maintaining a predetermined concentration of supply electrons in the conduction band of said charge transport layer, whereby at least some of said supply electrons are carried along said predetermined path in electron packets, having an average electron wavelength, by an electric potential traveling with said acoustic wave; and control means for controlling the passage of selected electron packets along said path, characterized in that:

said charge transport layer has a first conduction band potential and is positioned vertically between lower and upper confinement semiconductor layers, each having a higher conduction band potential than said transport layer conduction band potential; and said transport layer thickness is such that a potential well extends through said transport layer, whereby said electron packets are confined vertically in said charge transport layer by said potential well and said transport layer thickness is less than 50 nm.

2. A device according to claim 1, in which said lower and upper confinement semiconductor layer are formed of (Al,Ga)As; and said charge transport layer is formed of GaAs.

3. A device according to claim 1, in which said lower confinement semiconductor layer is formed from (Al,Ga)As, said charge transport layer is formed from (In,Ga)As, and said upper confinement semiconductor layer is formed from (Al,Ga)As.

* * * * *